United States Patent
Wada

(10) Patent No.: US 7,824,504 B2
(45) Date of Patent: Nov. 2, 2010

(54) ELECTRONIC DEVICE CLEANING EQUIPMENT AND ELECTRONIC DEVICE CLEANING METHOD

(75) Inventor: Yukihisa Wada, Kyoto (JP)

(73) Assignee: Panasonic Corporation, Osaka (JP)

( * ) Notice: Subject to any disclaimer, the term of this patent is extended or adjusted under 35 U.S.C. 154(b) by 1231 days.

(21) Appl. No.: 11/407,047

(22) Filed: Apr. 20, 2006

(65) Prior Publication Data

US 2007/0062559 A1   Mar. 22, 2007

(30) Foreign Application Priority Data

Sep. 22, 2005   (JP)   ............................. 2005-276095

(51) Int. Cl.
*B08B 3/04* (2006.01)
*B08B 3/08* (2006.01)

(52) U.S. Cl. .............................. 134/26; 134/2; 134/34; 134/36; 134/42

(58) Field of Classification Search ............... 134/2, 134/26, 34, 36, 42, 94.1, 95.1
See application file for complete search history.

(56) References Cited

U.S. PATENT DOCUMENTS

2003/0205253 A1* 11/2003 Shibagaki ................. 134/95.3
2004/0027777 A1* 2/2004 Komoriya et al. ........... 361/212

FOREIGN PATENT DOCUMENTS

| JP | 08-150377 | 6/1996 |
| JP | 10-189544 | 7/1998 |
| JP | 11-233473 | 8/1999 |
| JP | 2001-358109 | 12/2001 |
| JP | 2002-158202 | 5/2002 |
| JP | 2002-184660 | 6/2002 |

OTHER PUBLICATIONS

Machine Translation: JP10-189544 to Kimura et al. Jul. 1998.*
Japanese Office Action, with English translation, issued in Japanese Patent Application No. 2005-276095, mailed Dec. 15, 2009.

* cited by examiner

*Primary Examiner*—Michael Kornakov
*Assistant Examiner*—Natasha Campbell
(74) *Attorney, Agent, or Firm*—McDermott Will & Emery LLP

(57) ABSTRACT

An electronic device cleaning method includes the steps of: placing, on a processing face, a semiconductor substrate having an obverse face portion in which an electronic device is formed so that the processing face faces a reverse face of the semiconductor substrate; diselectrifying at least the reverse face of the semiconductor substrate by irradiating light to the semiconductor substrate by a light source provided at the processing face; and supplying a chemical solution to an obverse face of the semiconductor substrate after the dielectrifying step starts. Whereby, static electricity present on the processing face is removed reliably.

12 Claims, 10 Drawing Sheets

ELECTRONIC DEVICE CLEANING EQUIPMENT AND ELECTRONIC DEVICE CLEANING METHOD

CROSS REFERENCE TO RELATED APPLICATIONS

This Non-provisional application claims priority under 35 U.S.C. §119(a) on Patent Application No. 2005-276095 filed in Japan on Sep. 22, 2005, the entire contents of which are hereby incorporated by reference.

BACKGROUND ART

The present invention relates to electronic device cleaning equipment and an electronic device cleaning method, and particularly relates to single-wafer electronic device cleaning equipment and a single-wafer electronic device cleaning method.

Recently, demands for high speed and highly integrated electronic devices are increasing, and miniaturization of electronic devices is being promoted for realizing the demand. In association, cleaning methods for miniaturized electronic devices are in transition from batch cleaning to single-wafer cleaning for enhancing controllability in a region subjected to cleaning.

In a conventional single-wafer cleaning method, as shown in FIG. 10A, after a wafer 1 is placed on a processing face of a cleaning stage 114 located inside a cup 113 with a chuck pin 115 interposed, the obverse face of the wafer 1 is etched in such a manner that a chemical solution is discharged onto the obverse face of the wafer 1 from a chemical solution nozzle 111 while the wafer 1 supported on the cleaning stage 114 is rotated by a rotary table 116. Subsequently, as shown in FIG. 10B, the obverse face of the wafer 1 is cleaned with water by discharging water onto the obverse face of the wafer 1 from a water cleaning nozzle 112. Then, as shown in FIG. 10C, the obverse face of the wafer 1 is dried in such a manner that the wafer 1 supported on the cleaning stage 114 is rotated by the rotary table 116 to shake off water remaining on the obverse face of the wafer 1.

In the above conventional electronic device cleaning method, however, involves the following problems.

Rotation of the cleaning stage 114 supporting the wafer 1 by the rotary table 116 causes friction with air, thereby charging static electricity on the obverse face of the cleaning stage 114. Therefore, the static electricity is present on the processing face of the cleaning stage 114. For this reason, when the wafer 1 having an obverse face on which an insulating film is formed is cleaned, for example, the static electricity present on the processing face of the cleaning stage 114 is induced to the obverse face of the wafer 1 placed on the processing face of the cleaning stage 114 to cause discharge of the static electricity between the insulating film and the chemical solution discharged from the chemical solution nozzle 111.

Accordingly, the discharge of the static electricity forms a hole-like flaw at the obverse face of the wafer 1 (particularly, part of the insulating film where the chemical solution is supplied). As a result, the conventional electronic device cleaning method may lower yield of the electronic device.

For tackling this problem, a method for preventing flaws from being formed at the obverse face of a wafer (particularly, a circuit part of the wafer) is proposed as an electronic device cleaning method (a first conventional example). In this method, after a chemical solution is discharged onto a non-circuit part of a wafer with the use of a chemical solution nozzle capable of moving over the wafer, the chemical solution is discharged onto the circuit part of the wafer (see, for example, Japanese Patent Application Laid Open Publication No. 11-233473A).

According to this method, though a hole-like flaw may be formed by the static electricity discharge in part of the wafer where the chemical solution is supplied first, that is, the non-circuit part at the edge portion of the wafer, it is not formed in the circuit part of the wafer, attaining electronic device cleaning with no lowering of the yield of the electronic device.

Further, there is an electronic device cleaning method using cleaning equipment (see FIG. 11) (a second conventional example) which is aimed at removing the static electricity present on the processing face of the cleaning stage. As shown in FIG. 11, the electronic device cleaning equipment in the second conventional example includes, as main elements, a chamber 210, a chemical solution nozzle 211, a water nozzle 212a, a cap 213, a cleaning stage 214, a chuck pin 215, a rotary table 216, holding means 217, an FFU (fan filter unit) 218, a solution supply line 230, and a valve 231.

In the electronic device cleaning method of the second conventional example, a chemical solution is discharged onto the obverse face of the wafer 1 from the chemical solution nozzle 211 while a solution (a chemical solution, a soda water, or the like, for example) is discharged onto the central part of the reverse face of the wafer 1 from a solution nozzle 230a provided at the solution supply line 230 arranged in the cleaning stage 214. The solution supply to the reverse face of the wafer 1 removes the static electricity present on the processing face of the cleaning stage 214.

The electronic device cleaning method of the first conventional example, however, involves the following problems.

In the electronic device cleaning method of the first conventional example, the chemical solution must be discharged onto the non-circuit part at the edge portion of the wafer from the chemical solution nozzle 211. The selective discharge onto the non-circuit part is difficult, and therefore, the chemical solution is discharged onto part other than the non-circuit part at the edge portion of the wafer 1, that is, the circuit part of the wafer 1, to form a hole-like flaw by the static electricity discharge at the part of the circuit part of the wafer 1 where the chemical solution is discharged. Further, particles may adhere to the obverse face of the wafer 1 by the static electricity discharge.

In addition, in the electronic device cleaning method of the first conventional example, the chemical solution collides with the edge of the wafer 1 and is scattered in discharging the chemical solution, so that the chemical solution cannot be recovered to the cap 213 and the scattered chemical solution adheres to the obverse face of the wafer, resulting in contamination of the obverse face of the wafer 1.

As well, the electronic device cleaning method of the second conventional example involves the following problems.

In the electronic device cleaning method of the second conventional example, as shown in FIG. 11, the solution (a chemical solution, a soda water, or the like, for example) is supplied to the reverse face of the wafer 1 from the solution nozzle 230a provided at the solution supply line 230 arranged at the central part of the processing face of the cleaning stage 214. The solution supply to the edge portion of the reverse face of the wafer 1 is rather difficult.

Accordingly, the static electricity present on the processing face of the cleaning stage 214 (particularly, a range of the processing face of the cleaning stage 214 in the vicinity of the edge of the wafer 1) is removed insufficiently. As a result, the remaining static electricity is induced to the obverse face of the wafer 1 to cause the static electricity discharge between the obverse face of the wafer 1 and the chemical solution discharged from the chemical solution nozzle 211, thereby forming a hole-like flaw at the part of the obverse face of the wafer 1 where the chemical solution is discharged. Further, particles may adhere to the obverse face of the wafer 1 by the static electricity discharge.

As described above, in the electronic device cleaning methods of the first and second conventional examples, the static electricity discharge caused between the obverse face of the wafer and the chemical solution discharged from the chemical solution nozzle causes defects (specifically, flaws and particles), lowering the yield of the electronic device.

SUMMARY OF THE INVENTION

In view of the foregoing, the present invention has its object of providing electronic device cleaning equipment and an electronic device cleaning method in which static electricity discharge between the obverse face of a wafer and a chemical solution discharged from a chemical solution nozzle is prevented in chemical solution discharge by reliably removing the static electricity present on a processing face of a cleaning stage.

To attain the above object, electronic device cleaning equipment according to a first aspect of the present invention includes: a cleaning stage having a processing face on which a semiconductor substrate having an obverse face portion in which an electronic device is formed is to be placed so that the processing face faces a reverse face of the semiconductor substrate; a light source provided at the processing face for irradiating light to the semiconductor substrate; and chemical solution supply means for supplying a chemical solution to an obverse face of the semiconductor substrate.

In the electronic device cleaning equipment according to the first aspect of the present invention, the light source provided at the processing face irradiates light to the semiconductor substrate to generate ionized air in a region where the light is irradiated. This removes the static electricity present on the processing face, attaining effective prevention of induction of the static electricity to the obverse face of the semiconductor substrate.

Accordingly, the static electricity discharge between the obverse face of the semiconductor substrate and the supplied chemical solution is prevented. Whereby, a flaw, which would be formed by the static electricity discharge, is prevented from being formed at the obverse face of the semiconductor substrate (particularly, part of the obverse face of the semiconductor substrate where the chemical solution is supplied), and particles are prevented from adhering to the obverse face of the semiconductor substrate.

Hence, the electronic device cleaning equipment according to the first aspect of the present invention cleans the electronic device well without causing any defects (specifically, flaws and particles) at the obverse face of the semiconductor substrate, increasing yield of the electronic device.

In the electronic device cleaning equipment according to the first aspect of the present invention, the light is preferably a soft X ray.

With the above structure, the ionized air can be generated in a region where the soft X ray is irradiated to remove the static electricity present on the processing face. Further, even if the static electricity present on the processing face would be induced to the obverse face of the semiconductor substrate, and therefore, would be present thereon, the ionized air generated on the obverse face of the semiconductor substrate by the soft X ray transmitted through the semiconductor substrate would remove the static electricity present thereon.

Accordingly, the static electricity discharge is further prevented from being caused between the obverse face of the semiconductor substrate and the supplied chemical solution, so that a flaw, which would be formed by the static electricity discharge, is further prevented from being formed at the obverse face of the semiconductor substrate (particularly, part of the obverse face of the semiconductor substrate where the chemical solution is supplied), and particles are further prevented from adhering to the obverse face of the semiconductor substrate.

The electronic device cleaning equipment according to the first aspect of the present invention preferably includes oxygen gas supply means provided at the processing face for supplying an oxygen gas to the reverse face of the semiconductor substrate.

With the above structure, the oxygen gas can be supplied to the soft X ray irradiation region. The oxygen gas promotes a reaction of generating ionized air through the soft X ray irradiation, increasing the density of the ionized air on the processing face. This promotes neutralization of the static electricity by the ionized air, so that the static electricity present on the processing face can be further removed in a shorter period of time. Moreover, the soft X ray transmitted through the semiconductor substrate generates ionized air on the obverse face of the semiconductor substrate, removing the static electricity which would be present on the obverse face of the semiconductor substrate by induction from the processing face.

Hence, the static electricity discharge can be reliably prevented from being caused between the obverse face of the semiconductor substrate and the supplied chemical solution, and therefore, a flaw, which would be formed by the static electricity discharge, is prevented from being formed at the obverse face of the semiconductor substrate (particularly, part of the obverse face of the semiconductor substrate where the chemical solution is supplied), and particles are prevented from adhering to the obverse face of the semiconductor substrate.

Electronic device cleaning equipment according to a second aspect of the present invention includes: a cleaning stage having a processing face on which a semiconductor substrate having an obverse face portion in which an electronic device is formed is to be placed so that the processing face faces a reverse face of the semiconductor substrate; solution supply means which is provided at the processing face and in which a plurality of first discharge ports for discharging a solution onto the reverse face of the semiconductor substrate are formed dispersedly; and chemical solution supply means for supplying a chemical solution to an obverse face of the semiconductor substrate.

In the electronic device cleaning equipment according to the second aspect of the present invention, the solution supply means in which the plurality of first discharge ports are formed dispersedly enables uniform supply of the solution (a chemical solution, a soda water, or the like, for example) to the reverse face of the semiconductor substrate. This leads to effective removal of the static electricity present on the processing face, effectively preventing induction of the static electricity to the obverse face of the semiconductor substrate.

Hence, the static electricity discharge can be prevented from being caused between the obverse face of the semiconductor substrate and the supplied chemical solution, and therefore, a flaw, which would be formed by the static electricity discharge, is prevented from being formed at the obverse face of the semiconductor substrate (particularly, part of the obverse face of the semiconductor substrate where the chemical solution is supplied), and particles are prevented from adhering to the obverse face of the semiconductor substrate.

In turn, the electronic device cleaning equipment according to the second aspect of the present invention cleans the electronic device well without generating any defects (specifically, flaws and particles) at the obverse face of the semiconductor substrate, increasing the yield of the electronic device.

The electronic device cleaning equipment according to the second aspect of the present invention preferably includes first control means for allowing the plurality of first discharge ports of the solution supply means to discharge the solution onto the reverse face of the semiconductor substrate before the chemical solution supply means supplies the chemical solution to the obverse face of the semiconductor substrate.

In this structure, the solution is supplied to the reverse face of the semiconductor substrate prior to supply of the chemical solution to the obverse face of the semiconductor substrate. Accordingly, the static electricity present on the processing face is removed in advance, effectively preventing induction of the static electricity to the obverse face of the semiconductor substrate.

Hence, the static electricity discharge can be effectively prevented from being caused between the obverse face of the semiconductor substrate and the supplied chemical solution, and therefore, a flaw, which would be formed by the static electricity discharge, is prevented from being formed at the obverse face of the semiconductor substrate (particularly, part of the obverse face of the semiconductor substrate where the chemical solution is supplied), and particles are effectively prevented from adhering to the obverse face of the semiconductor substrate.

In the electronic device cleaning equipment according to the second aspect of the present invention, it is preferable that a second discharge port is formed in the chemical solution supply means and the equipment further includes second control means for allowing a first discharge port located correspondingly to the second discharge port of the chemical solution supply means out of the plurality of first discharge ports to discharge the solution onto the reverse face of the semiconductor substrate.

With the above structure, the solution can be discharged onto the reverse face of the semiconductor substrate from a first discharge port located correspondingly to the second discharge port out of the plurality of first discharge ports. This enables solution discharge from the first discharge port onto a region of the reverse face of the semiconductor substrate where it corresponds to a region of the obverse face of the semiconductor substrate where the chemical solution is supplied, reliably preventing induction of the static electricity to the obverse face of the semiconductor substrate (particularly, the chemical solution supply region of the obverse face of the semiconductor substrate).

Hence, the static electricity discharge can be reliably prevented from being caused between the obverse face of the semiconductor substrate and the chemical solution discharged from the second discharge port, and therefore, a flaw, which would be formed by the static electricity discharge, is reliably prevented from being formed at the obverse face of the semiconductor substrate (particularly, part of the obverse face of the semiconductor substrate where the chemical solution is supplied), and particles are reliably prevented from adhering to the obverse face of the semiconductor substrate.

In the electronic device cleaning equipment according to the second aspect of the present invention, the solution is preferably a chemical solution or soda water.

Whereby, the static electricity preset on the processing face can be removed.

An electronic device cleaning method according to the first aspect of the present invention includes the steps of: (a) placing, on a processing face, a semiconductor substrate having an obverse face portion in which an electronic device is formed so that the processing face faces a reverse face of the semiconductor substrate; (b) diselectrifying at least the reverse face of the semiconductor substrate by irradiating light to the semiconductor substrate by a light source provided at the processing face; and (c) supplying a chemical solution to an obverse face of the semiconductor substrate after the step (b) starts.

In the electronic device cleaning method according to the first aspect of the present invention, the light is irradiated to the semiconductor substrate with the use of the light source provided at the processing face to generate ionized air in the light irradiation region, thereby removing the static electricity present on the processing face. Accordingly, the static electricity is effectively prevented from being induced to the obverse face of the semiconductor substrate.

Hence, the static electricity discharge can be prevented from being caused between the obverse face of the semiconductor substrate and the supplied chemical solution, and therefore, a flaw, which would be formed by the static electricity discharge, is prevented from being formed at the obverse face of the semiconductor substrate (particularly, part of the obverse face of the semiconductor substrate where the chemical solution is supplied), and particles are prevented from adhering to the obverse face of the semiconductor substrate.

Therefore, the electronic device cleaning method according to the first aspect of the present invention attains excellent cleaning of the electronic device without generating any defects (specifically, flaws and particles) at the obverse face of the semiconductor substrate, increasing the yield of the electronic device.

In the electronic device cleaning method according to the first aspect of the present invention, it is preferable that in the step (b), a soft X ray is irradiated as the light irradiated to the semiconductor substrate.

With the above arrangement, ionized air can be generated in the soft X ray irradiation region to remove the static electricity present on the processing face. Further, even if the static electricity present on the processing face would be induced to the obverse face of the semiconductor substrate, and therefore, would be present thereon, the ionized air generated on the obverse face of the semiconductor substrate by the soft X ray transmitted through the semiconductor substrate would remove the static electricity present thereon.

Accordingly, the static electricity discharge is further prevented from being caused between the obverse face of the semiconductor substrate and the supplied chemical solution, so that a flaw, which would be formed by the static electricity discharge, is further prevented from being formed at the obverse face of the semiconductor substrate (particularly, part of the obverse face of the semiconductor substrate where the chemical solution is supplied), and particles are further prevented from adhering to the obverse face of the semiconductor substrate.

In the electronic device cleaning method according to the first aspect of the present invention, the step (b) is preferably performed while an oxygen is supplied to the reverse face of the semiconductor substrate.

In the above arrangement, the oxygen gas is supplied to the soft X ray irradiation region. The oxygen gas promotes a reaction of generating ionized air through the soft X ray irradiation, increasing the density of the ionized air on the processing face. This promotes neutralization of the static electricity by the ionized air, so that the static electricity present on the processing face can be further removed in a shorter period of time. Moreover, the soft X ray transmitted through the semiconductor substrate generates the ionized air on the obverse face of the semiconductor substrate, removing the static electricity which would be present on the obverse face of the semiconductor substrate by induction from the processing face.

Hence, the static electricity discharge can be reliably prevented from being caused between the obverse face of the semiconductor substrate and the supplied chemical solution, and therefore, a flaw, which would be formed by the static electricity discharge, is reliably prevented from being formed at the obverse face of the semiconductor substrate (particularly, part of the obverse face of the semiconductor substrate where the chemical solution is supplied), and particles are reliably prevented from adhering to the obverse face of the semiconductor substrate.

Moreover, with the above arrangement, the static electricity present on the processing face can be removed within a shorter period of time. This means shortening of diselectrification time, that is, shortening time required for a diselectrification step, resulting in an increase in productivity.

An electronic device cleaning method according to the second aspect of the present invention includes the steps of: (a) placing, on a processing face, a semiconductor substrate having an obverse face portion in which an electronic device is formed so that the processing face faces a reverse face of the semiconductor substrate; (b) diselectrifying the reverse face of the semiconductor substrate by supplying a solution to the reverse face of the semiconductor substrate from a plurality of first discharge ports formed dispersedly at the processing face; and (c) supplying a chemical solution to an obverse face of the semiconductor substrate from a second discharge port after the step (b) starts.

In the electronic device cleaning method according to the second aspect of the present invention, the plurality of first discharge ports formed dispersedly at the processing face enables uniform supply of the solution (a chemical solution, a soda water, or the like, for example) to the reverse face of the semiconductor substrate. This attains effective removal of the static electricity present on the processing face, effectively preventing induction of the static electricity to the obverse face of the semiconductor substrate.

Further, in the electronic device cleaning method according to the second aspect of the present invention, the chemical solution is supplied to the obverse face of the semiconductor substrate after supply of the solution to the reverse face of the semiconductor substrate starts, rather than simultaneous supply of the solution to the reverse face of the semiconductor substrate and of the chemical solution to the obverse face thereof. Therefore, the static electricity present on the processing face can be removed in advance, effectively preventing induction of the static electricity to the obverse face of the semiconductor substrate.

Hence, the static electricity discharge can be effectively prevented from being caused between the obverse face of the semiconductor substrate and the chemical solution discharged from the second discharge port, and therefore, a flaw, which would be formed by the static electricity discharge, is effectively prevented from being formed at the obverse face of the semiconductor substrate (particularly, part of the obverse face of the semiconductor substrate where the chemical solution is supplied), and particles are effectively prevented from adhering to the obverse face of the semiconductor substrate.

In turn, the electronic device cleaning method according to the second aspect of the present invention attains excellent cleaning of the electronic device without generating any defects (specifically, flaws and particles) at the obverse face of the semiconductor substrate, increasing the yield of the electronic device.

In the electronic device cleaning method according to the second aspect of the present invention, it is preferable that in the step (b), the solution is supplied to the reverse face of the semiconductor substrate from a first discharge port located correspondingly to the second discharge port out of the plurality of first discharge ports.

By this method, the solution is discharged in advance onto the reverse face of the semiconductor substrate from a first discharge port located correspondingly to the second discharger port out of the plurality of discharge ports. This enables advance solution discharge from the first discharge port onto the region of the reverse face of the semiconductor substrate where it corresponds to the chemical solution supply region of the obverse face of the semiconductor substrate, reliably preventing induction of the static electricity to the obverse face of the semiconductor substrate (particularly, the chemical solution supply region of the obverse face of the semiconductor substrate).

Advance removal of the static electricity present on the processing face under the second discharge port surely prevents induction of the static electricity to the obverse face of the semiconductor substrate (particularly, the obverse face of the semiconductor substrate under the second discharge port).

Hence, the static electricity discharge can be reliably prevented from being caused between the obverse face of the semiconductor substrate and the chemical solution discharged from the second discharge port, and therefore, a flaw, which would be formed by the static electricity discharge, is reliably prevented from being formed at the obverse face of the semiconductor substrate (particularly, part of the obverse face of the semiconductor substrate where the chemical solution is supplied), and particles are reliably prevented from adhering to the obverse face of the semiconductor substrate.

In the electronic device cleaning method according to the second aspect of the present invention, it is preferable that in the step (b), a chemical solution or a soda water is supplied as the solution supplied to the reverse face of the semiconductor substrate.

By this method, the static electricity present on the processing face can be removed.

As described above, in the electronic device cleaning equipment and the electronic device cleaning methods according to the first and second aspects of the present invention, the static electricity discharge in chemical solution discharge is prevented from being caused between the obverse face of the wafer and the chemical solution discharged from the chemical nozzle, increasing the yield of the electronic device.

DESCRIPTION OF THE PREFERRED EMBODIMENTS

Each embodiment of the present invention will be described below with reference to the accompanying drawings.

Embodiment 1

Figure 1:
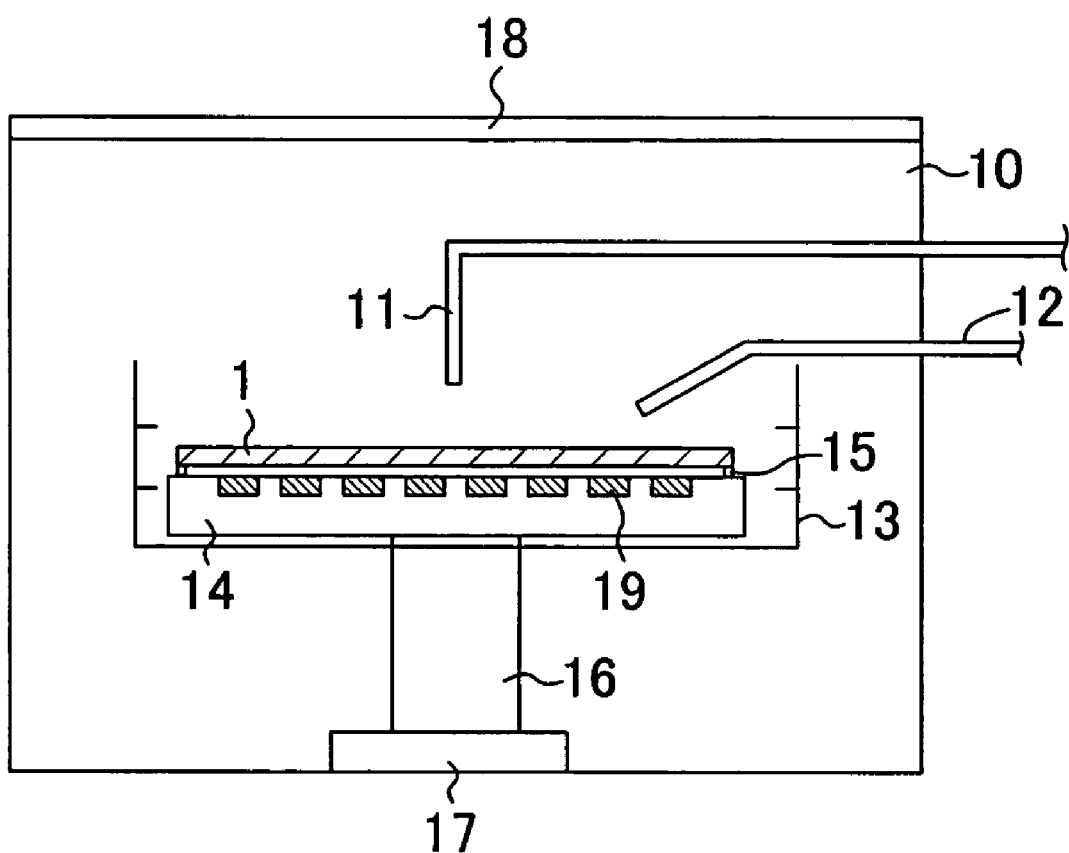
FIG. 1 is a section showing a construction of electronic device cleaning equipment according to Embodiment 1 of the present invention.

The construction of electronic device cleaning equipment according to Embodiment 1 of the present invention will be described below with reference to FIG. 1. FIG. 1 is a section showing the construction of the electronic device cleaning equipment according to Embodiment 1 of the present invention.

As shown in FIG. 1, the electronic device cleaning equipment in the present embodiment includes, as main elements, a cleaning chamber 10, a chemical solution nozzle 11 for discharging a chemical solution onto the obverse face of a wafer 1, a water nozzle 12 for discharging water onto the obverse face of the wafer 1, a cap 13 for recovering the chemical solution and the water, a cleaning stage 14 having a processing face on which the wafer 1 is to be placed, a chuck pin 15 for holding the wafer 1, a rotary table 16 for rotating the wafer 1, holding means 17 for holding the cap 13, the cleaning stage 14, and the rotary table 16, an FFU (fan filter unit) 18 provided at the upper part of the cleaning chamber 10, and a soft X ray irradiation system 19 provided at the processing face of the cleaning stage 14 so as to face the reverse face of the wafer 1.

An electronic device cleaning method using the electronic device cleaning equipment according to Embodiment 1 of the present invention will be described below with reference to FIG. 2A to FIG. 2D. FIG. 2A to FIG. 2D are sections showing main steps of the electronic device cleaning method according to Embodiment 1 of the present invention.

Figure 2A:
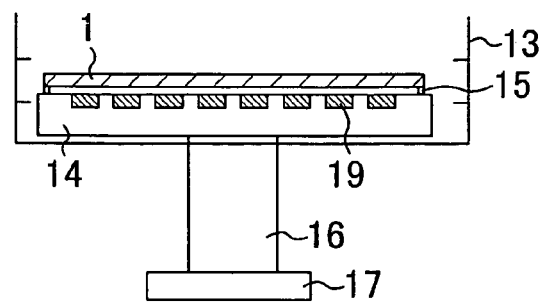
FIG. 2A to FIG. 2D are sections showing main steps of an electronic device cleaning method according to Embodiment 1 of the present invention.

First, as shown in FIG. 2A, a wafer 1 having an obverse face portion in which, for example, an electronic device (not shown) is formed is placed on the processing face of the cleaning stage 14 with the chuck pin 15 interposed. Then, a soft X ray is irradiated to the reverse face of the wafer 1 by the soft X ray irradiation system 19 provided at the processing face of the cleaning stage 14 for a predetermined time period for diselectrification of the wafer 1.

Figure 2B:
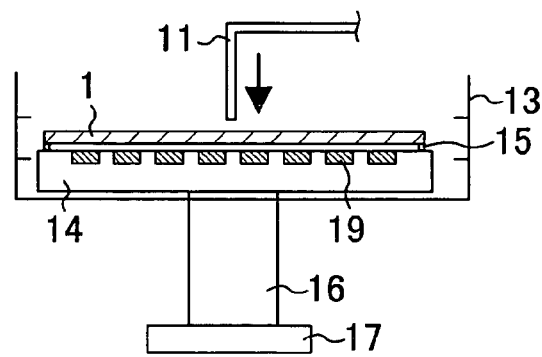

Next, as shown in FIG. 2B, the obverse face of the wafer 1 is subjected to etching in such a manner that a chemical solution is discharged onto the obverse face of the wafer 1 from the chemical solution nozzle 11 for a predetermined time period for etching while the wafer 1 supported on the cleaning stage 14 is rotated by the rotary table 16.

Figure 2C:
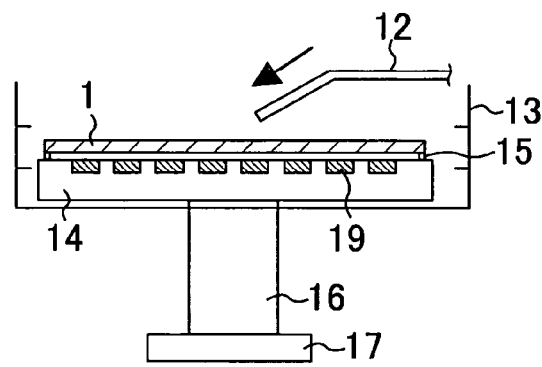
Figure 2D:
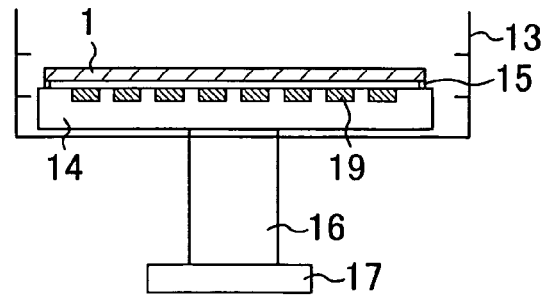

Subsequently, as shown in FIG. 2C, the obverse face of the wafer 1 is water cleaned in such a manner that water is discharged onto the obverse face of the wafer 1 from the water nozzle 12 while the wafer 1 supported on the cleaning stage 14 is rotated by the rotary table 16. Then, as shown in FIG. 2D, the obverse face of the wafer 1 is dried in such a manner that the wafer 1 supported on the cleaning stage 14 is rotated by the rotary table 16 to shake off water remaining on the obverse face of the wafer 1.

Herein, in order to effectively explain the effects of the present embodiment, the following evaluation is performed on a wafer subjected to cleaning by a conventional electronic device cleaning method and a wafer subjected to cleaning by the electronic device cleaning method according to the present embodiment.

First, a wafer is cleaned by the conventional electronic device cleaning method under the cleaning condition indicated below.

Figure 10A:
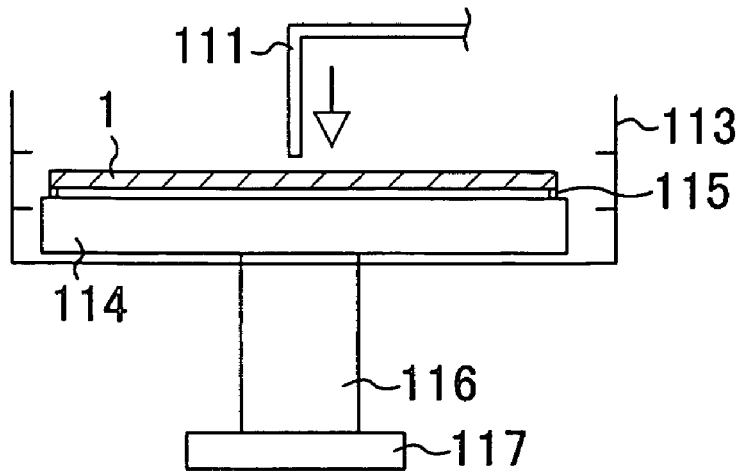
FIG. 10A to FIG. 10C are sections showing main steps of a conventional electronic device cleaning method.
Figure 10B:
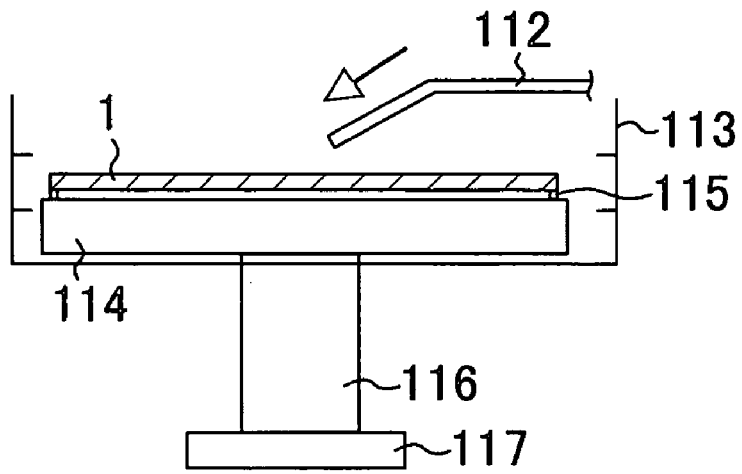
Figure 10C:
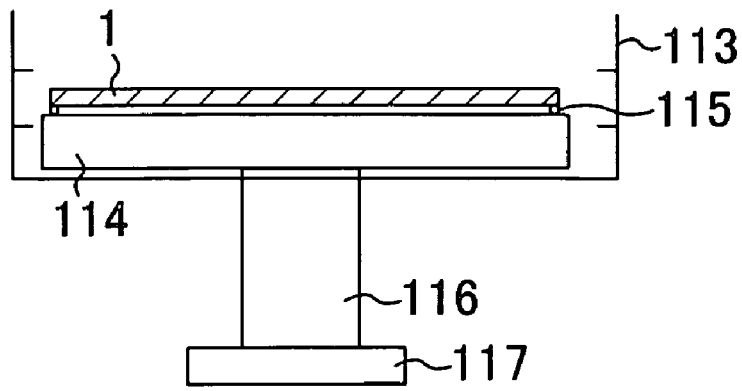

Specifically, etching is performed on a thermal oxide film (not shown) formed on the wafer 1 and having a film thickness of 100 nm with the use of the conventional electronic device cleaning equipment, as described with reference to FIG. 10A, in such a manner that a DHF solution (diluted hydrofluoric acid: a mixed solution having a volume ratio of $HF:H_2O=1:10$) is discharged onto the central part of the obverse face of the thermal oxide film from the chemical solution nozzle 111 for 10 seconds in an atmosphere at room temperature (23° C.) while the wafer 1 supported on the cleaning stage 114 is rotated by the rotary table 116. Then, after the obverse face of the wafer 1 is water cleaned as described with reference to in FIG. 10B, the obverse face of the wafer 1 is dried as describe with reference to FIG. 10C.

Meanwhile, a wafer is cleaned by the electronic device cleaning method according to the present embodiment under the following cleaning conditions.

Specifically, the wafer 1 is subjected to diselectrification using the electronic device cleaning equipment according to the present embodiment, as shown in FIG. 2A, in such a manner that the soft X ray is irradiated to the reverse face of the wafer 1 for a predetermined time period for diselectrification (10 seconds) by the soft X ray irradiation system 19 provided at the processing face of the cleaning stage 14.

Subsequently, etching is performed on a thermal oxide film (not shown) formed on the wafer 1 and having a film thickness of 100 nm, as shown in FIG. 2B, in such a manner that the DHF solution (the mixed solution having a volume ratio of $HF:H_2O=1:10$) is discharged onto the central part of the obverse face of the thermal oxide film from the chemical solution nozzle 111 for 10 seconds in an atmosphere at room temperature (23° C.) while the wafer 1 supported on the cleaning stage 14 is rotated by the rotary table 16. Then, after the obverse face of the wafer 1 is water cleaned as shown in FIG. 2C, the obverse face of the wafer 1 is dried as shown in FIG. 2D.

Figure 3A:
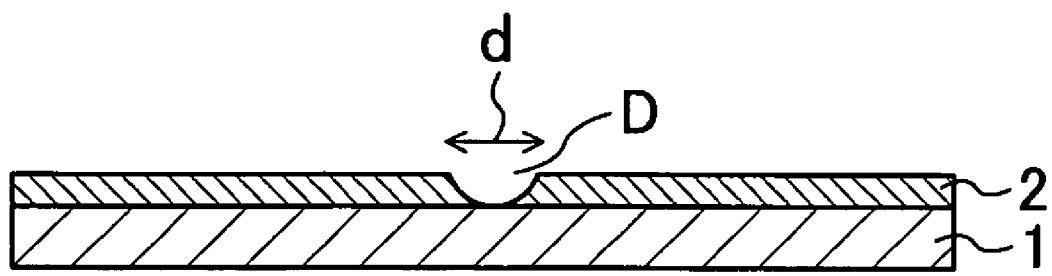
FIG. 3A and FIG. 3B are sections showing the structures of wafers subjected to cleaning by respective electronic device cleaning methods.
Figure 3B:
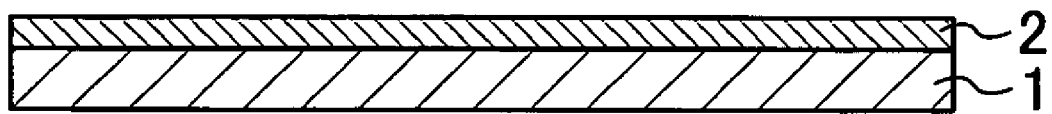

Particles of 0.16 μm or larger adhering to the respective wafers subjected to cleaning by the conventional electronic device cleaning method or to cleaning by the electronic device cleaning method according to the present embodiment under the aforementioned cleaning condition (etching condition: at 23° C., for 10 seconds, HF:H$_2$O=1:10) were counted as defects by a particle counter for evaluating the defects at the respective wafers. The defects at the wafers will be described below with reference to Table 1, FIG. 3A, and FIG. 3B. Table 1 indicates each number of defects at the wafers and defect types thereof. FIG. 3A and FIG. 3B are sections showing the structures of the wafers subjected to cleaning by the respective electronic device cleaning methods.

TABLE 1

|  | Number of defects | | | Defect type | |
| --- | --- | --- | --- | --- | --- |
|  | Before processing | After processing | Increased number | Damage due to static electricity | Particle |
| Conventional example | 3 | 7 | 4 | 1 | 3 |
| Embodiment 1 | 4 | 4 | 0 | 0 | 0 |

Table 1 indicates that the number of defects of the wafer subjected to cleaning by the conventional electronic device cleaning method is three before the processing and seven after the processing, which means an increase in the number of defects after the processing compared with those before the processing (specifically, four defects increased). Detailed evaluation of the defects observed after the processing (specifically, the four defects) was carried out using SEM defect inspection equipment. The wafer defects observed after the processing will be described below with reference to FIG. 3A. FIG. 3A is a section showing the structure of the wafer subjected to cleaning by the conventional electronic device cleaning method.

As shown in FIG. 3A, a hole D having a diameter d of approximately 1 μm was formed at the central part of the thermal oxide film 2 formed on the wafer 1. It was confirmed that the hole D, which was one of the four defects observed after the processing, was formed in such a way that the thermal oxide film 2 was damaged by static electricity discharge caused at the space between the obverse face of the wafer 1 and the DHF solution discharged from the chemical solution nozzle 111. The defects other than the hole D, that is, three defects out of the four defects (not shown) observed after the processing were recognized as particles.

On the other hand, Table 1 indicates that each number of defects before and after the processing is four in the wafer subjected to cleaning by the electronic device cleaning method according to the present embodiment, which means no increase in the number of defects after the processing compared with those before the processing. FIG. 3B is a section showing the structure of the wafer subjected to cleaning by the electronic device cleaning method according to the present embodiment and indicates that no damage by the static electricity discharge was observed at the obverse face of the wafer 1.

In sum, the number of defects after the cleaning processing increased compared with that before the cleaning processing in the wafer subjected to the conventional electronic device cleaning under the aforementioned cleaning condition (etching condition: at 23° C., for 10 seconds, HF:H$_2$O=1:10). While, no increase in the number of defects was observed after the cleaning processing compared with those before the cleaning processing in the wafer subjected to cleaning by the electronic device cleaning method according to the present embodiment. From this, it was understood that the static electricity present on the processing face of the cleaning stage 14 was removed by irradiating the soft X ray to the reverse face of the wafer 1 before the cleaning processing.

As described above, in the electronic device cleaning method according to the present embodiment, as shown in FIG. 2A, the soft X ray is irradiated to the reverse face of the wafer 1 by the soft X ray irradiation system 19 provided at the processing face of the cleaning stage 14 before the cleaning processing (see FIG. 2B to FIG. 2D).

The soft X ray irradiation generates ionized are in a region where the soft X ray is irradiated to remove the static electricity present on the processing face of the cleaning stage 14, preventing induction of the static electricity to the obverse face of the wafer 1.

Further, even if the static electricity present on the processing face of the cleaning stage 14 would be induced to the obverse face of the wafer 1, and therefore, would be present on the obverse face of the wafer 1, the static electricity thereon could be removed by the ionized air generated on the obverse face of the wafer 1 through irradiation of the soft X ray, which is transmitted through the wafer 1.

Accordingly, in supplying the chemical solution in the cleaning processing (see FIG. 2B), the static electricity discharge is prevented from being causing between the obverse face of the wafer 1 and the chemical solution discharged from the chemical solution nozzle 11, preventing a hole-like flaw D, which would be formed by the static electricity discharge, from being formed at the obverse face of the wafer 1 (particularly, part of the obverse face of the wafer 1 where the chemical solution is supplied) and preventing adhesion of particles to the obverse face of the wafer 1.

Hence, according to the electronic device cleaning method in the present embodiment, the electronic device can be cleaned well without generating defects (specifically, flaws and particles) at the obverse face of the wafer 1, increasing the yield of the electronic device.

Figure 11:
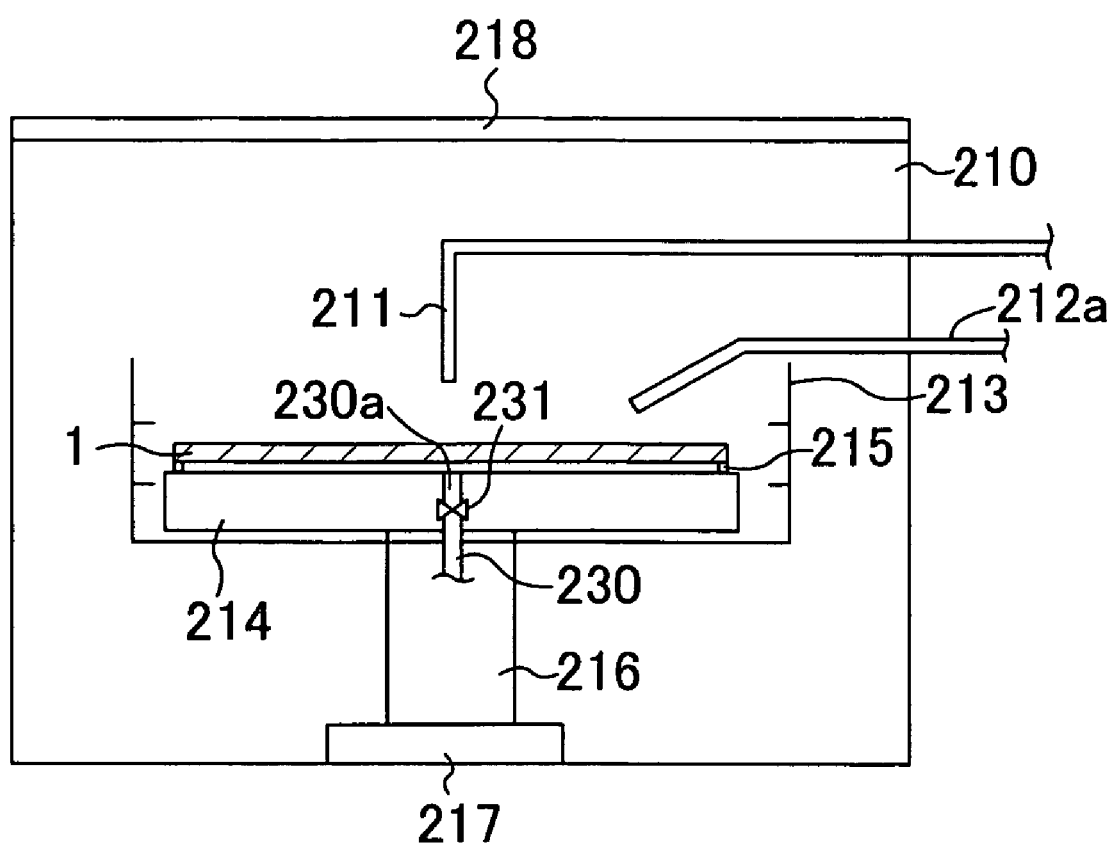
FIG. 11 is a section showing a construction of electronic device cleaning equipment according to the second conventional example.

Moreover, the electronic device cleaning equipment in the present embodiment includes the soft X ray irradiation system 19 as shown in FIG. 1, rather than the conventional one including the solution supply line (see the reference numeral 230 in FIG. 11). The soft X ray irradiation system 19 is not so cumbersome compared with the solution supply line, resulting in reduction in size of the electronic device cleaning equipment.

Embodiment 2

Figure 4:
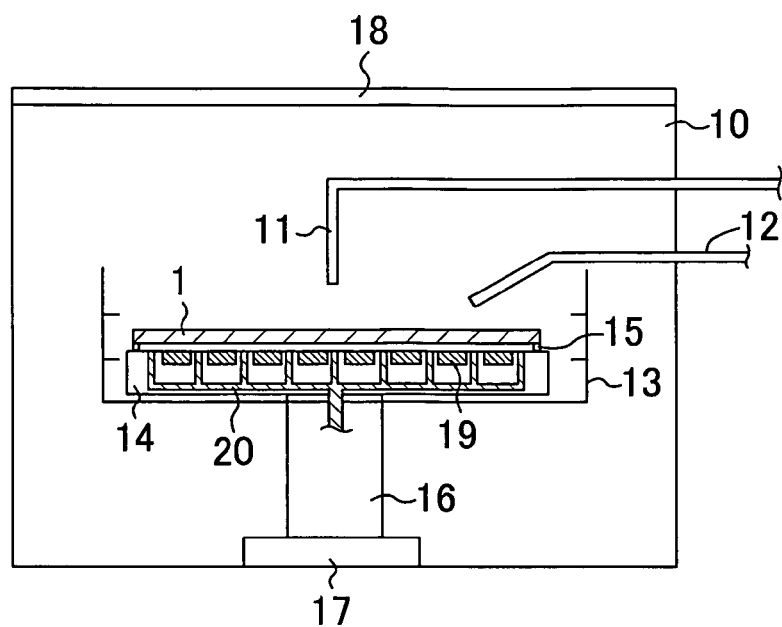
FIG. 4 is a section showing a construction of electronic device cleaning equipment according to Embodiment 2 of the present invention.

The construction of electronic device cleaning equipment according to Embodiment 2 of the present invention will be described below with reference to FIG. 4. FIG. 4 is a section showing the construction of the electronic device cleaning equipment according to Embodiment 2 of the present invention. In FIG. 4, the same reference numerals are assigned to the same elements as those in the electronic device cleaning equipment according to Embodiment 1 of the present invention. Therefore, the same description as that of the electronic device cleaning equipment according to Embodiment 1 of the present invention is not repeated.

The soft X ray is irradiated on the reverse face of the wafer 1 for a predetermined time period for diselectrification by the soft X ray irradiation system 19 provided at the processing face of the cleaning stage 14 in Embodiment 1. While in Embodiment 2, the soft X ray is irradiated on the reverse face of the wafer 1 for a predetermined time period for diselectrification by the soft X ray irradiation system 19 provided at the processing face of the cleaning stage 14 with an oxygen gas supplied to the reverse face of the wafer 1 by an oxygen gas supply line 20 provided at the processing face of the cleaning stage 14.

As shown in FIG. 4, the electronic device cleaning device according to the present embodiment includes not only the soft X ray irradiation system 19 as in the electronic device cleaning equipment according to Embodiment 1 of the present invention but also the oxygen gas supply line 20 provided at the processing face of the cleaning stage 14.

An electronic device cleaning method using the electronic device cleaning equipment according to Embodiment 2 of the present invention will be described below briefly.

First, a wafer 1 having an obverse face portion in which, for example, an electronic device (not shown) is formed is placed on the processing face of the cleaning stage 14 with the chuck pin 15 interposed. Then, the wafer 1 is subjected to diselectrification in such a manner that a soft X ray is irradiated to the reverse face of the waver 1 for a predetermined time period for diselectrification by the soft X ray irradiation system 19 provided at the processing face of the cleaning stage 14 while the oxygen gas is supplied to the reverse face of the wafer 1 by the oxygen gas supply line 20 provided at the processing face of the cleaning stage 14.

Next, similarly to the step shown in FIG. 2B, the obverse face of the wafer 1 is subjected to etching in such a manner that a chemical solution is discharged onto the obverse face of the wafer 1 from the chemical solution nozzle 11 for a predetermined time period for etching while the wafer 1 supported on the cleaning stage 14 is rotated by the rotary table 16. Then, after the obverse face of the wafer 1 is water cleaned similarly to the step shown in FIG. 2C, the obverse face of the wafer 1 is dried similarly to the step shown in FIG. 2D.

As described above, in the electronic device cleaning method according to the present embodiment, the soft X ray is irradiated to the reverse face of the wafer 1 while the oxygen gas is supplied to the reverse face of the wafer 1. In general, it is known that supply of an oxygen gas to a region where a soft X ray is irradiated promotes a reaction of generating ionized air through the soft X ray irradiation. Accordingly, the soft X ray irradiation to the reverse face of the wafer 1 with the oxygen gas supplied to the reverse face thereof increases the density of the ionized air generated from the oxygen gas in the soft X ray irradiation region, resulting in effective removal of the static electricity present on the processing face of the cleaning stage 14.

Herein, in order to effectively explain the effects of the present embodiment, the following evaluation was performed on a wafer subjected to cleaning by the electronic device cleaning method according to Embodiment 1 of the present invention and a wafer subjected to cleaning by the electronic device cleaning method according to the present embodiment.

First, the relationship between the time periods for diselectrification and the numbers of defects at the wafers was evaluated in the wafers subjected to cleaning by the electronic device cleaning method according to Embodiment 1 of the present invention.

In this evaluation, the wafers 1 were subjected to diselectrification for respective predetermined time periods for diselectrification (specifically, 2.5 seconds, 5 seconds, and 10 seconds), as shown in FIG. 2A, in such a manner that the soft X ray was irradiated to the reverse faces of the wafers 1 by the soft X ray irradiation system 19 provided at the processing face of the cleaning stage 14. Then, etching was performed on the thermal oxide films (not shown) formed on the respective wafers 1 and having a film thickness of 100 nm, as shown in FIG. 2B, in such a manner that a DHF solution (a mixed solution of HF:H$_2$O=1:10 in volume ratio) was discharged onto the obverse faces of the thermal oxide films from the chemical solution nozzle 11 for 10 seconds in an atmosphere at room temperature (23° C.) while the wafers 1 supported on the cleaning stage 14 were rotated by the rotary table 16. Next, after the obverse faces of the wafers 1 were water cleaned as shown in FIG. 2C, the obverse faces of the wafers 1 were dried as shown in FIG. 2D.

In the wafers subjected to cleaning by the electronic device cleaning method according to Embodiment 1 under the aforementioned cleaning condition (etching condition: at 23° C., for 10 seconds, HF:H$_2$O=1:10) for the respective predetermined time periods for diselectrification, defects generated at the wafers were evaluated by counting particles having a size of 0.16 μm or larger by a particle counter. The relationship between the time periods for diselectrification and the numbers of defects at the wafers will be described with reference to Table 2. Table 2 shows the relationship between the time periods for diselectrification and the numbers of defects generated at the wafers subjected to cleaning by the electronic device cleaning method according to Embodiment 1 of the present invention.

TABLE 2

| Diselectrification period (sec.) | Number of defects | | | Defect type | |
|---|---|---|---|---|---|
| | Before processing | After processing | Increased number | Damage due to static electricity | particle |
| 2.5 | 4 | 11 | 7 | 1 | 6 |
| 5 | 5 | 9 | 4 | 1 | 3 |
| 10 | 4 | 4 | 0 | 0 | 0 |

Table 2 indicates that of the wafers subjected to cleaning by the electronic device cleaning method according to Embodiment 1, the number of defects before the processing and that after the processing are four and 11, respectively, in the wafer subjected to diselectrification for 2.5 seconds, which means an increase in the number of defects after the processing compared with those before the processing (specifically, seven defects increased). Detailed evaluation of the defects observed at the wafer after the processing (specifically, the seven defects) was carried out using SEM defect inspection equipment. This evaluation confirmed that one of the seven defects observed after the processing was a hole-like flaw and six defects out of the seven defects observed after the processing were particles.

Further, as indicated in Table 2, the number of defects before the processing and that after the processing are five and nine, respectively, in the wafer subjected to diselectrification for 5 seconds, which means an increase in the number of defects after the processing compared with those before the processing (specifically, four defects increased). Detailed evaluation of the defects observed at the wafer after the processing (specifically, the four defects) was carried using SEM defect inspection equipment. This evaluation confirmed that one of the four defects observed after the processing was a hole-like flaw and three defects out of the four defects observed after the processing were particles.

In contrast, as indicated in Table 2, each number of defects before the processing and after the processing was four in the wafer subjected to diselectrification for 10 seconds, which means no increase in the number of defects after the processing compared with those before the processing.

Next, the relationship between the time periods for diselectrification and the numbers of defects at the wafers was evaluated in the wafers subjected to cleaning by the electronic device cleaning according to the present embodiment.

In this evaluation, the wafers 1 were subjected to dielectrification for respective predetermined time periods for dielectrification (specifically, 2.5 seconds, 5 seconds, and 10 seconds) in such a manner that the soft X ray was irradiated to the reverse faces of the wafers 1 by the soft X ray irradiation system 19 provided at the processing face of the cleaning stage 14 while the oxygen gas was supplied to the reverse faces of the wafers 1 by the oxygen gas supply line 20 provided at the processing face of the cleaning stage 14. Then, etching was performed on the thermal oxide films (not shown) formed on the wafers 1 and having a film thickness of 100 nm, similarly to the step shown in FIG. 2B, in such a manner that the DHF solution (the mixed solution of $HF:H_2O=1:10$ in volume ratio) was discharged onto the obverse faces of the thermal oxide films from the chemical solution nozzle 11 for 10 seconds under an atmosphere at room temperature (23° C.) while the wafers 1 supported on the cleaning stage 14 were rotated by the rotary table 16. Next, after the obverse faces of the wafers 1 were water cleaned similarly to the step shown in FIG. 2C, the obverse faces of the wafers 1 were dried similarly to the step shown in FIG. 2D.

In the wafers subjected to cleaning by the electronic device cleaning method according to the present embodiment under the aforementioned cleaning condition (etching condition: at 23° C., for 10 seconds, $HF:H_2O=1:10$) for the respective predetermined time periods for diselectrification, defects generated at the wafers were evaluated by counting particles having a size of 0.16 μm or larger as defects by a particle counter. The relationship between the time periods for diselectrification and the numbers of defects at the wafers will be described with reference to Table 3. Table 3 indicates the relationship between the time periods for diselectrification and the numbers of defects generated at the wafers subjected to cleaning by the electronic device cleaning method according to Embodiment 2 of the present invention.

TABLE 3

| Diselectrification period (sec.) | Number of defects | | | Defect type | |
|---|---|---|---|---|---|
| | Before processing | After processing | Increased number | Damage due to static electricity | particle |
| 2.5 | 1 | 1 | 0 | 0 | 0 |
| 5 | 4 | 4 | 0 | 0 | 0 |
| 10 | 2 | 2 | 0 | 0 | 0 |

Table 3 indicates that each number of defects before the processing and after the processing is one in the wafer subjected to diselectrification for 2.5 seconds, which means no increase in the number of defects after the processing compared with those before the processing. Also, each number of defects before the processing and after the processing is four in the wafer subjected to diselectrification for 5 seconds, which means no increase in the number of defects after the processing compared with those before the processing. In addition, each number of defects before the processing and those after the processing is two in the wafer subjected to diselectrification for 10 seconds, which means no increase in the number of defects after the processing compared with those before the processing.

As described above, in the electronic device cleaning method according to Embodiment 1 of the present invention, as indicated in Table 2, mere soft X ray irradiation for 2.5 seconds or 5 seconds to the reverse face of the wafer 1 under the aforementioned cleaning condition (etching condition: at 23° C., for 10 seconds, $HF:H_2O=1:10$) leads to insufficient removal of the static electricity present on the processing face of the cleaning stage 14. As a result, defects (specifically, flaws and particles) are formed at the wafer 1 in discharging chemical solution in the cleaning processing by the static electricity remaining even after the diselectrification step.

In contrast, in the electronic device cleaning method according to the present embodiment, as indicated in Table 3, no increase in the number of defects after the processing is observed in any of the wafers subjected to diselectrification for 2.5 seconds, 5 seconds, or 10 seconds under the cleaning condition (etching condition: at 23° C., for 10 seconds, $HF:H_2O=1:10$), compared with the respective numbers of defects before the processing. This proves that the soft X ray irradiation to the reverse face of the wafer 1 with the oxygen gas supplied to the reverse face of the wafer attains excellent removal of the static electricity present on the processing face of the cleaning stage 14 within a shorter period of time.

As described above, in the electronic device cleaning method according to the present embodiment, the soft X ray is irradiated to the reverse face of the wafer 1 while the oxygen gas is supplied to the reverse face of the wafer 1.

The irradiation of the soft X ray to the reverse face of the wafer 1 generates ionized air in a region where the soft X ray is irradiated. The ionized air removes the static electricity present on the processing face of the cleaning stage 14.

Further, the supply of the oxygen gas to the soft X ray irradiation region promotes a reaction of generating ionized air through the soft X ray irradiation, resulting in an increase in density of the ionized air on the processing face of the cleaning stage 14. Accordingly, the ionized air of increased density promotes neutralization of the static electricity. Hence, the static electricity present on the processing face of the cleaning stage 14 can be further removed within a shorter period of time, compared with that in Embodiment 1.

Further, even if the static electricity present on the processing face of the cleaning stage 14 would be induced to the obverse face of the wafer 1, and therefore, would be present on the obverse face of the wafer 1, the static electricity present thereon could be removed by the ionized air generated on the obverse face of the wafer 1 through irradiation of the soft X ray, which is transmitted through the wafer 1.

Accordingly, the static electricity discharge is reliably prevented from being caused between the obverse face of the wafer 1 and the chemical solution discharged from the chemical solution nozzle 11, preventing a hole-like flaw, which would be formed by the static electricity discharge, from being formed at the obverse face of the wafer 1 (particularly, part of the obverse face of the wafer 1 where the chemical solution is supplied) and preventing adhesion of particles to the obverse face of the wafer 1.

In addition, in the electronic device cleaning method according to the present embodiment, the static electricity present on the processing face of the cleaning stage 14 can be removed within a shorter period of time compared with that in Embodiment 1. This means shortening of diselectrification time, that is, shortening of time required for the diselectrification step, resulting in an increase in productivity.

Embodiment 3

Figure 5:
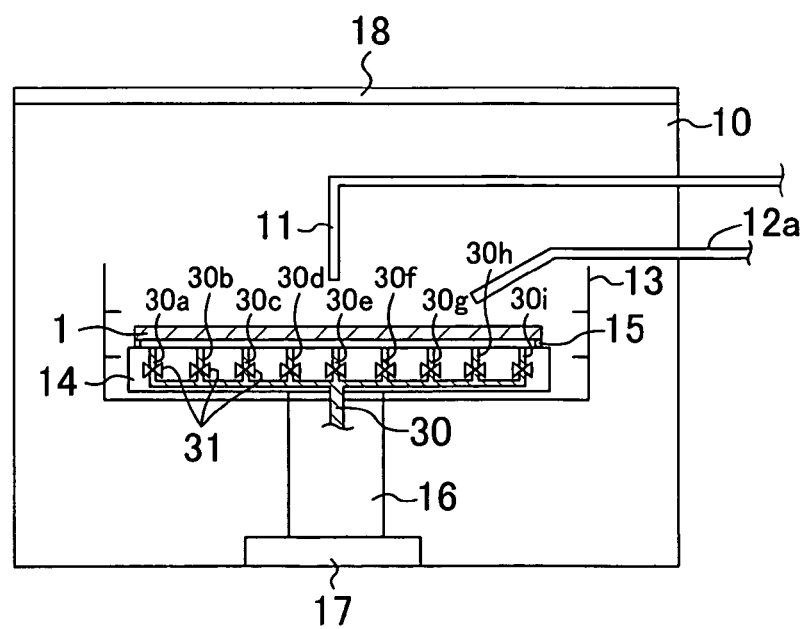
FIG. 5 is a section showing a construction of electronic device cleaning equipment according to Embodiment 3 of the present invention.

The construction of electronic device cleaning equipment according to Embodiment 3 of the present invention will be described below with reference to FIG. 5. FIG. 5 is a section showing the construction of the electronic device cleaning equipment according to Embodiment 3 of the present invention. In FIG. 5, the same reference numerals are assigned to the same elements as those in the electronic device cleaning equipment according to Embodiment 1 of the present invention. Therefore, the same description as that of the electronic device cleaning equipment according to Embodiment 1 of the present invention is not repeated.

One of significant features of the present embodiment lies in that in a wafer diselectrification step, a solution (for example, a chemical solution, a soda water, or the like) is discharged onto the reverse face of the wafer in advance from a solution nozzle located correspondingly to the chemical solution nozzle out of a plurality of solution nozzles provided at a solution supply line arranged at the processing face of the cleaning stage before the chemical solution is discharged from the chemical solution nozzle onto the obverse face of the wafer.

Referring to the electronic device cleaning equipment according to the second conventional example, the solution (for example, a chemical solution, a soda water, or the like) must be supplied to the reverse face of the wafer 1 from the solution nozzle 230a provided at the solution supply line 230 arranged at the central part of the processing face of the cleaning state 214, as shown in FIG. 11, causing difficulty in solution supply to the vicinity of the edge of the wafer 1.

Under the circumstances, in the electronic device cleaning equipment according to the present embodiment, a plurality of solution nozzles 30a to 30i are formed dispersedly in the solution supply line 30 provided in the cleaning stage 14, wherein a valve 31 is provided in each of the plurality of solution nozzles 30a to 30.

Accordingly, in the electronic device cleaning equipment according to the present embodiment, as shown in FIG. 5, the solution (for example, a chemical solution, a soda water, or the like) can be supplied to the entirety of the reverse face of the wafer 1 from the plurality of solution nozzles 30a to 30i dispersedly formed in the solution supply line 30 at the processing face of the cleaning stage 14, attaining uniform solution supply to the reverse face of the wafer 1.

Recent single-wafer electronic device cleaning methods employ a method of supplying an APM solution (Ammonia Hydrogen Peroxide Mixture, a mixed solution of $NH_4OH:H_2O_2:H_2O=1:1:40$ in volume ratio) to the obverse face of the wafer for a short period of time (30 second, for example) in an atmosphere at high temperature (approximately 70° C., for example), and the chemical solution nozzle performs scanning in general in order to ensure etching uniformity. Further, in view of particle removal, in many recent single-wafer electronic device cleaning methods, a chemical solution is discharged onto the obverse face of a wafer from the chemical solution nozzle from the edge of the obverse face of the wafer as a starting point by allowing the chemical solution nozzle to perform scanning.

Under the circumstances, the following evaluation was performed on wafers subjected to cleaning by first to third electronic device cleaning methods under the aforementioned cleaning conditions (etching condition: at 70° C., for 30 seconds, $NH_4OH:H_2O_2:H_2O=1:1:40$). Specifically, wafers on which thermal oxide films having a thickness of 100 nm are formed were subjected to etching under an atmosphere at 70° C. for 30 seconds by supplying the APM solution (a mixed solution of $NH_4OH:H_2O_2:H_2O=1:1:40$ in volume ratio), and then, defects at the wafers were evaluated using a particle counter.

The first to third electronic device cleaning methods will be described first in detail.

Referring to the first electronic device cleaning method, a wafer is cleaned by the electronic device cleaning method according to the second conventional example under the aforementioned cleaning condition (etching condition: at 70° C., for 30 seconds, $NH_4OH:H_2O_2:H_2O=1:1:40$) with the use of the electronic device cleaning equipment according to the second conventional example. The electronic device cleaning method according to the second conventional example will be described below with reference to FIG. 6A to FIG. 6C.

Figure 6A:
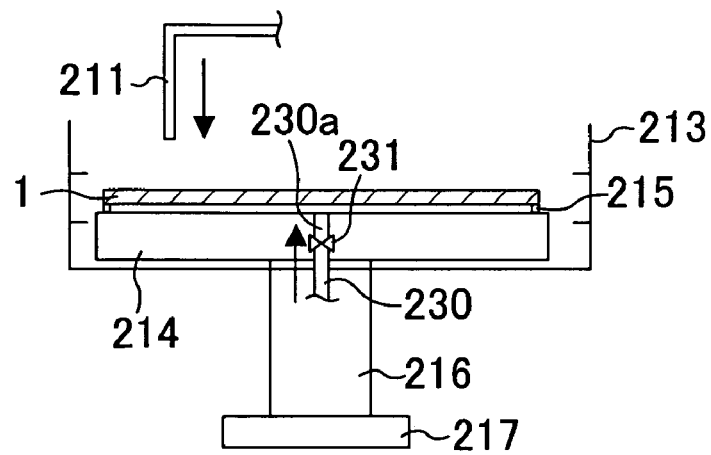
FIG. 6A to FIG. 6C are sections showing main steps of an electronic device cleaning method according to a second conventional example.

First, as shown in FIG. 6A, the thermal oxide film is subjected to etching (see the aforementioned etching conditions) in such a manner that the APM solution is discharged onto the obverse face of the wafer 1 from the chemical solution nozzle 211 with the chemical solution nozzle 211 allowed to perform scanning from a point approximately 1 cm apart from one of edges of the wafer 1 as a starting point towards the other edge of the wafer 1 while the wafer 1 supported on the cleaning stage 214 is rotated at a rotation speed of 300 rpm by the rotary table 216.

Figure 6B:
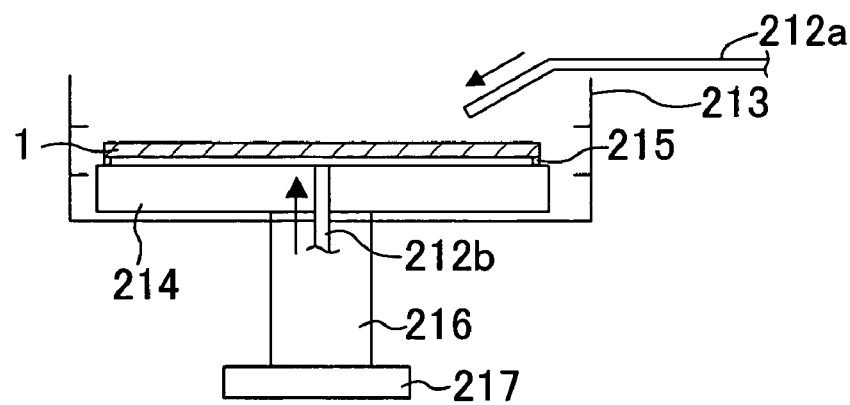
Figure 6C:
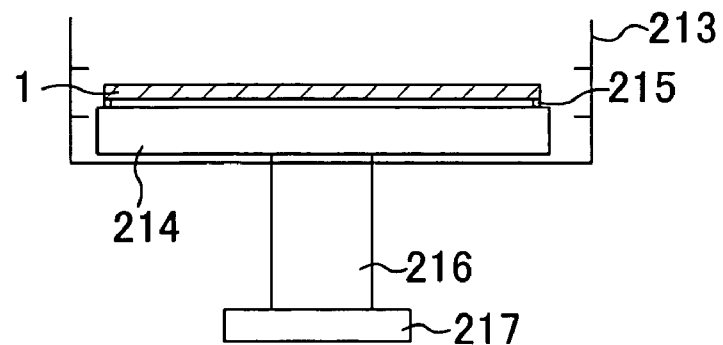

In this etching, as shown in FIG. 6A, in order to diselectrify the reverse face of the wafer 1, the APM solution is discharged onto the reveres face of the wafer 1 (particularly, the central part of the reverse face of the wafer 1) from the solution nozzle 230a provided at the solution supply line 230 for a second time period for diselectrification (30 seconds) at the same time when the APM solution is discharged onto the obverse face of the wafer 1 from the chemical solution nozzle 211. Then, after the obverse face of the wafer 1 is water cleaned as shown in FIG. 6B, the obverse face of the wafer 1 is dried as shown in FIG. 6C.

In the second electronic device cleaning method, the wafer 1 is cleaned under the aforementioned cleaning condition (etching condition: at 70° C., for 30 seconds, $NH_4OH:H_2O_2:H_2O=1:1:40$) with the use of the electronic device cleaning equipment according to the second conventional example. The electronic device cleaning method using the electronic device cleaning equipment according to the second conventional example will be described below with reference to FIG. 7A to FIG. 7D.

Figure 7A:
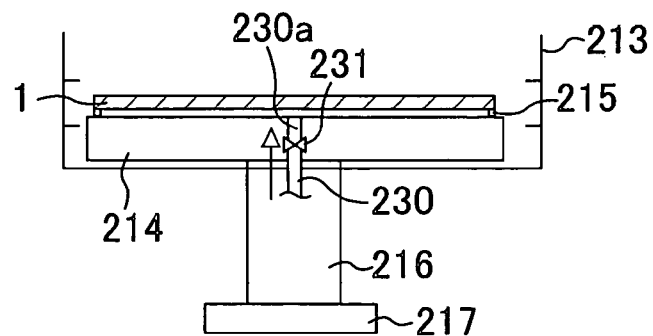
FIG. 7A to FIG. 7C are sections showing main steps of a second electronic device cleaning method.

First, as shown in FIG. 7A, the reverse face of the wafer 1 is subjected to diselectrification in such a manner that the APM solution is discharged onto the reverse face of the wafer 1 (particularly, the central part of the reverse face of the wafer 1) from the solution nozzle 230a provided at the solution supply line 230 for a first time period for diselectrification (30 seconds) while the wafer 1 supported on the cleaning stage 214 is rotated at a rotation speed of 300 rpm by the rotary table 216.

Figure 7B:
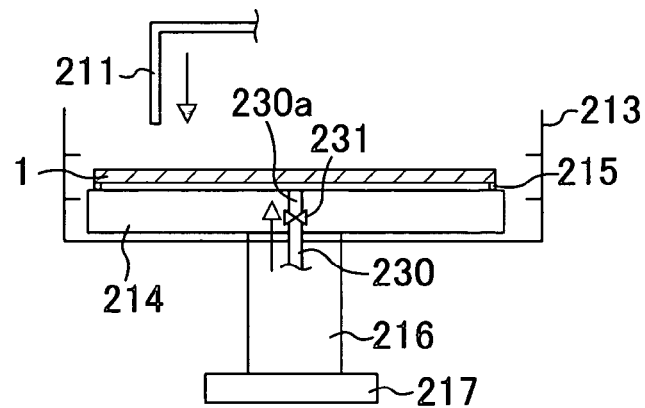
Figure 7C:
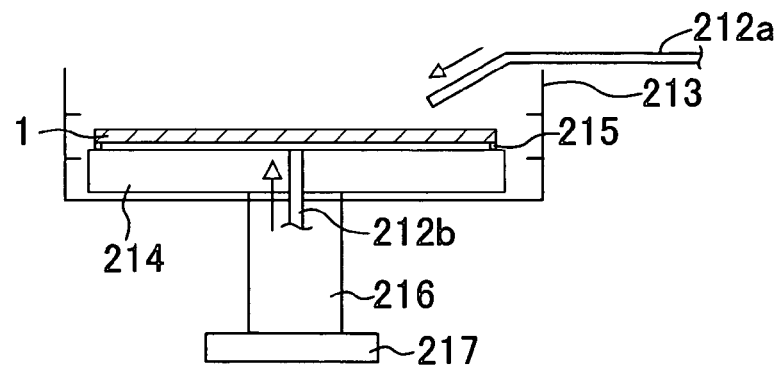
Figure 7D:
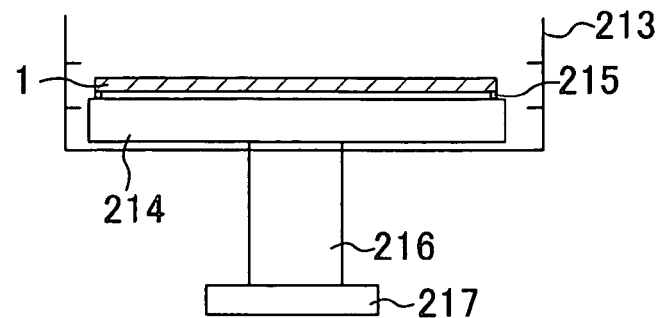

Subsequently, as shown in FIG. 7B, the thermal oxide film is subjected to etching (see the aforementioned etching conditions) in such a manner that the APM solution is discharged onto the obverse face of the wafer 1 from the chemical solution nozzle 211 with the chemical solution nozzle 211 allowed to perform scanning from a point approximately 1 cm apart from one of edges as a starting point towards the other edge of the wafer 1 while the APM solution is discharged onto the reverse face of the wafer 1 from the solution nozzle 230a for the second time period for diselectrification (30 seconds). Then, after the obverse face of the wafer 1 is water cleaned as shown in FIG. 7C, the obverse face of the wafer 1 is dried as shown in FIG. 7D.

Referring to the third electronic device cleaning method, a wafer is cleaned by the electronic device cleaning method under the aforementioned cleaning conditions (etching condition: at 70° C., for 30 seconds, $NH_4OH:H_2O_2:H_2O=1:1:40$) with the use of the electronic device cleaning equipment according to the present embodiment. The electronic device cleaning method according to the present embodiment will be described below with reference to FIG. 8A to FIG. 8D.

Figure 8A:
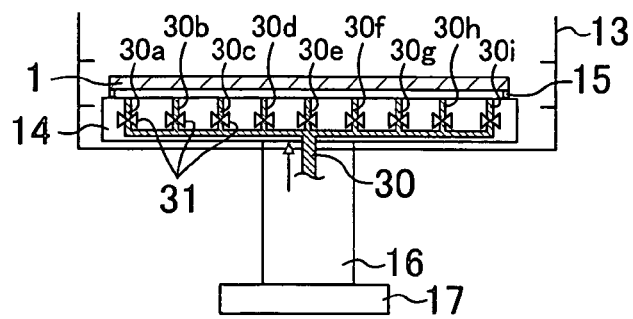
FIG. 8A to FIG. 8D are sections showing main steps of an electronic device cleaning method according to Embodiment 3 of the present invention.

First, as shown in FIG. 8A, the reverse faces of the wafers 1 are subjected to diselectrification in such a manner that the APM solution is discharged onto the reverse face of the wafers 1 from the plurality of solution nozzles 30a to 30i provided at the solution supply line 30 for respective first predetermined time periods for diselectrification (specifically, 10 seconds and 30 seconds) while the wafer 1 supported on the cleaning stage 14 is rotated at a rotation speed of 300 rpm by the rotary table 16.

Figure 8B:
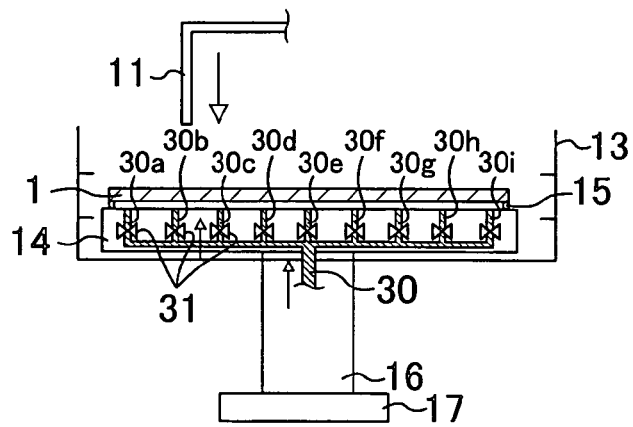

Subsequently, as shown in FIG. 8B, each thermal oxide film is subjected to etching (see the aforementioned etching conditions) in such a manner that the APM solution is discharged onto the obverse face of the wafer 1 from the chemical solution nozzle 211 with the chemical solution nozzle 211 allowed to perform scanning from a point approximately 1 cm apart from one of edges as a starting point towards the other edge of the wafer 1 while the APM solution is discharged onto the reverse face of the wafer 1 from a solution nozzle located correspondingly to the chemical solution nozzle 11 for the second time period for diselectrification (30 seconds).

In this etching, the APM solution is supplied to the reverse face of the wafer 1 from a solution nozzle (solution nozzle 30b, for example) located correspondingly to the chemical solution nozzle 11 out of the plurality of solution nozzles 30a to 30i so that the static electricity present on the processing face of the cleaning stage 14 is not induced to the obverse face of the wafer 1 (particularly, part of the obverse face of the wafer 1 where the chemical solution is supplied) in the cleaning processing.

Figure 8C:
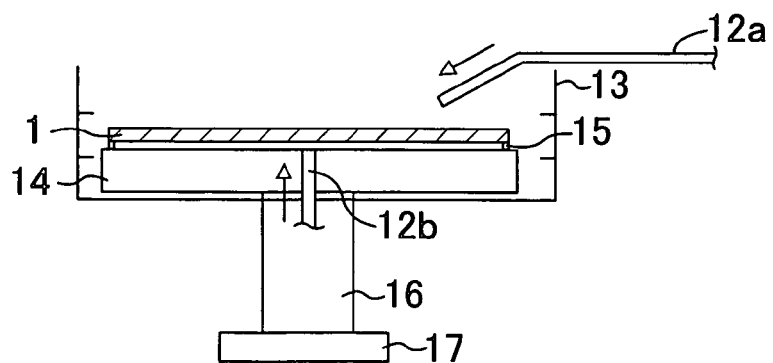
Figure 8D:
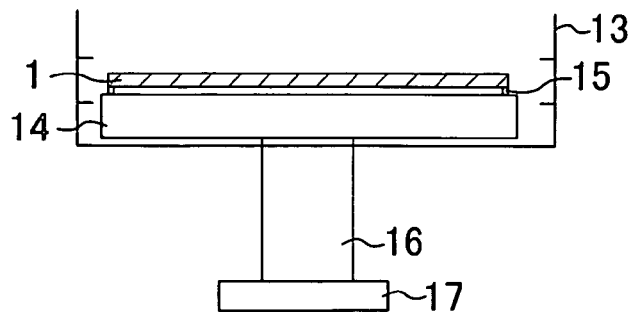

Next, after the obverse face of the wafer 1 is water cleaned as shown in FIG. 8C, the obverse face of the wafer 1 is dried as shown in FIG. 8D.

As described above, in the electronic device cleaning method according to the present embodiment, the solution (the APM solution, for example) is discharged in advance onto the reverse face of the wafer 1 from the plurality of solution nozzles 30a to 30i provided at the solution supply line 30 with the use of, for example, a first controller (not shown), as shown in FIG. 8A, before, the chemical solution is discharged onto the obverse face of the wafer 1 from the chemical solution nozzle 11 (see FIG. 8B). Then, the chemical solution is discharged onto the obverse face of the wafer 1 from the chemical solution nozzle 11 movable over the obverse face of the wafer 1 while the solution is discharged onto the reverse face of the wafer 1 from a solution nozzle (the solution nozzle 30b, for example) located correspondingly to the chemical solution nozzle 11 out of the plurality of solution nozzles 30 with the use of a second controller (not shown), as shown in FIG. 8B.

Figure 9A:
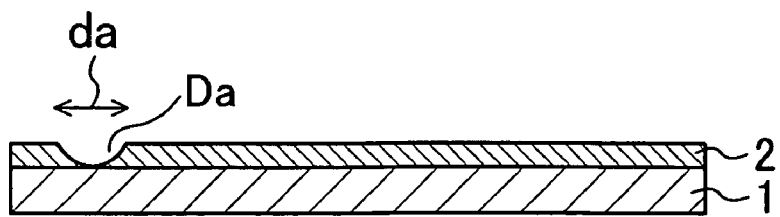
FIG. 9A to FIG. 9C are sections showing the structures of wafers subjected to cleaning by first to third electronic device cleaning methods, respectively.
Figure 9B:
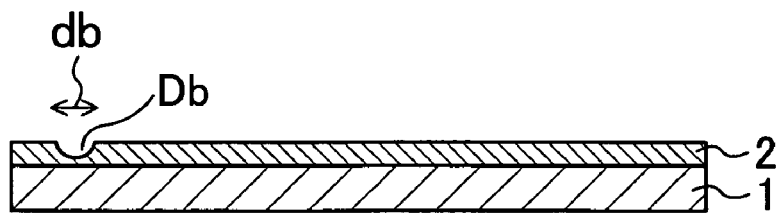
Figure 9C:
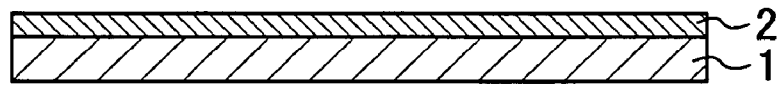

The respective wafers subjected to cleaning by the first to third electronic device cleaning methods under the aforementioned cleaning conditions (etching condition: at 70° C., for 30 seconds, $NH_4OH:H_2O_2:H_2O=1:1:40$) were evaluated by counting particles of 0.16 μm or larger as defects at the respective wafers by a particle counter. The defects at each wafer will be described below with reference to Table 4 and FIG. 9A to FIG. 9C. Table 4 indicates each number of defects at the wafers and defect types thereof. FIG. 9A to FIG. 9C are sections showing the structures of the respective wafers subjected to cleaning by the first to third electronic device cleaning methods.

TABLE 4

|  | First diselectrification period (sec.) | Number of defects | | | Defect type | |
| --- | --- | --- | --- | --- | --- | --- |
|  |  | Before processing | After processing | Increased number | Damage due to static electricity | particle |
| 1st | 0 | 2 | 8 | 6 | 1 | 5 |
| 2nd | 30 | 1 | 3 | 2 | 1 | 1 |
| 3rd | 10 | 2 | 2 | 0 | 0 | 0 |
|  | 30 | 4 | 4 | 0 | 0 | 0 |

Referring to the wafer 1 subjected to cleaning by the first electronic device cleaning method, that is, the electronic device cleaning method according to the second conventional example, Table 4 indicates that the numbers of defects before the processing and after the processing are two and eight, respectively, which means an increase in the number of defects after the processing compared with those before the processing (specifically, six defects increased). Detailed evaluation of the defects after the processing (specifically, the six defects) was carried out by SEM defect inspection equipment. The wafer defects after the processing will be described below with reference to FIG. 9A. FIG. 9A is a section showing the structure of the wafer subjected to cleaning by the first electronic device cleaning method.

As shown in FIG. 9A, a hole Da having a diameter da of approximately 1 μm was formed at part approximately 1 cm apart from the edge of the wafer 1 having an obverse face on which the thermal oxide film 2 is formed, that is, part of the obverse face of the wafer 1 where the APM solution is discharged first. The hole Da, which is one of the six defects observed after the processing, was formed in such a way that the thermal oxide film 2 was damaged by the static electricity discharge caused in the space between the obverse face of the wafer 1 and the APM solution discharged from the chemical solution nozzle 211. Further, the defects other than the hole Da, that is, five defects out of the six defects after the processing were recognized as particles (not shown).

Referring to the wafer 1 subjected to cleaning by the second electronic device cleaning method, Table 4 indicates that the numbers of defects before the processing and after the processing are one and three, respectively, which means an increase in the number of defects after the processing compared with those before the processing (specifically, two defects increased). Detailed evaluation of the defects after the processing (specifically, the two defects) was carried out by SEM defect inspection equipment. The wafer defects after the processing will be described below with reference to FIG. 9B. FIG. 9B is a section showing the structure of the wafer subjected to cleaning by the second electronic device cleaning method.

As shown in FIG. 9B, a hole Db having a diameter db of approximately 0.5 μm was formed at part approximately 1 cm apart from the edge of the wafer 1 having an obverse face on which the thermal oxide film 2 is formed, that is, part of the obverse face of the wafer 1 where the APM solution is discharged first. The hole Da, which is one of the two defects observed after the processing, was formed in such a way that the thermal oxide film 2 was damaged by static electricity discharge caused in the space between the obverse face of the wafer 1 and the APM solution discharged from the chemical solution nozzle 211. Further, the defect other than the hole Db, that is, one defect out of the two defects after the processing was recognized as a particle (not shown).

In contrast, referring to the wafer 1 subjected to cleaning by the third electronic device cleaning method, Table 4 indicates that each number of defects before the processing and after the processing is four in the case where the first time period for diselectrification is 30 seconds, which means no increase in the number of defects after the processing compared with those before the processing. Also, as indicated in Table 4, each number of defects before the processing and after the processing is two in the case where the first time period for diselectrification is 10 seconds, which means no increase in the number of defects after the processing compared with those before the processing. FIG. 9C is a section showing the structure of the wafer subjected to cleaning by the third electronic device cleaning method, wherein the first time period for diselectrification is 10 seconds. As shown in FIG. 9C, no damage by the static electricity discharge is observed at the obverse face of the wafer 1.

As described above, the static electricity present on the processing face of the cleaning stage 14 can be removed in advance by supplying the solution to the reverse face of the wafer 1 before the chemical solution is supplied to the obverse face of the wafer 1, attaining effective prevention of induction of the static electricity to the obverse face of the wafer 1. Further, the solution can be discharged onto the reverse face of the wafer 1 from a solution nozzle located correspondingly to the chemical solution nozzle 11 out of the plurality of solution nozzles 30a to 30i provided at the solution supply line 30, so that the static electricity present on the processing face of the cleaning stage 14 under the chemical solution nozzle 11 can be removed. Thus, induction of the static electricity to a region of the obverse face of the wafer 1 under the chemical solution nozzle, that is, the chemical solution supply region of the obverse face of the wafer 1 can be prevented reliably.

Accordingly, the static electricity discharge can be prevented from being caused in the space between the obverse face of the wafer 1 and the chemical solution discharged from the chemical solution nozzle 11, reliably preventing formation of a hole-like flaw at the obverse face of the wafer 1 (particularly, part of the obverse face of the wafer 1 where the chemical solution is supplied) and reliably preventing adhesion of particles to the obverse face of the wafer 1, which would be caused due to the static electricity discharge.

Hence, by the electronic device cleaning method according to the present embodiment, the electronic device can be cleaned excellently without causing defects (specifically, flaws and particles) at the wafer 1, improving the yield of the electronic device.

Further, in the electronic device cleaning method according to the present embodiment, diselectrification of the wafer 1 is performed using the solution supply line 30 as shown in FIG. 8A, which is different from the first and second embodiments in which the wafer 1 is diselectrified with the use of the soft X ray irradiation system (see the reference numeral 19 in FIG. 2A), achieving electronic device cleaning at low cost compared with the first and second embodiments.

It is noted that the APM solution is used as the solution to be supplied to the reverse face of the wafer 1 in the electronic device cleaning method according to the present embodiment but the present invention is not limited thereto, and the same effects can be obtained even when a soda water, an inorganic chemical solution, an organic chemical solution, or the like is used as the solution to be supplied to the reverse face of the wafer 1.

Moreover, in the electronic device cleaning method according to the present embodiment, the solution is discharged onto the reverse face of the wafer 1 from the plurality of solution nozzles 30a to 30i provided at the solution supply line 30 for the first time period for diselectrification as shown in FIG. 8A, and the solution is discharged onto the reverse face of the wafer 1 from a solution nozzle (for example, the solution nozzle 30b) located correspondingly to the chemical solution nozzle 11 out of the plurality of solution nozzles for the second time period for diselectrification, as shown in FIG. 8B. However, the present invention is not limited to this specific example. The same effects as in the electronic device cleaning method according to the present embodiment can be obtained in the case where the solution is discharged onto the reverse face of the wafer 1 from the plurality of solution nozzles for the first time period for diselectrification and for the second time period for diselectrification or in the case where the solution is discharged onto the reverse face of the wafer 1 from a solution nozzle located correspondingly to the chemical solution nozzle 11 out of the plurality of solution nozzles for the first time period for diselectrification and for the second time period for diselectrification.

As described above, the present invention is useful for electronic device cleaning equipment and electronic device cleaning methods, particularly, for single-wafer electronic device cleaning equipment and single-wafer electronic device cleaning methods.

What is claimed is:

1. An electronic device cleaning method, comprising the steps of:
    (a) placing, on a processing face, a semiconductor substrate having an obverse face portion in which an electronic device is formed so that the processing face faces a reverse face of the semiconductor substrate;
    (b) diselectrifying the reverse face of the semiconductor substrate by supplying a solution to the reverse face of the semiconductor substrate from a plurality of first discharge ports formed dispersedly at the processing face; and
    (c) supplying a chemical solution to an obverse face of the semiconductor substrate from a second discharge port after the step (b) starts, wherein
    at least one of the first discharge ports is located in a vicinity of one of the edges of the semiconductor substrate.

2. The electronic device cleaning method of claim 1,
    wherein in the step (b), the solution is supplied to the reverse face of the semiconductor substrate from a first discharge port located correspondingly to the second discharge port out of the plurality of first discharge ports, and
    the second discharge port is located at a position to start to supply the chemical solution in the vicinity of the one of the edges of the semiconductor substrate.

3. The electronic device cleaning method of claim 1, wherein in the step (b), a chemical solution or a soda water is supplied as the solution supplied to the reverse face of the semiconductor substrate.

4. The electronic device cleaning method of claim 2, wherein in the step (c), the second discharge port performs scanning from the one of the edges to another one of the edges of the semiconductor substrate.

5. The electronic device cleaning method of claim 4, wherein the step (c) includes a step (d) of supplying the solution to the reverse face of the semiconductor substrate from one of said plurality of first discharge ports, said one of said plurality of first discharge ports facing the second discharge port.

6. The electronic device cleaning method of claim 1, wherein the step (b) includes a step (e) of generating ionized air in the vicinity of the semiconductor substrate.

7. The electronic device cleaning method of claim 6, wherein the step (e) is a step of generating the ionized air by irradiating light to the semiconductor substrate.

8. The electronic device cleaning method of claim 7, wherein the light is a soft X ray.

9. The electronic device cleaning method of claim 8, wherein the soft X ray is irradiated to the reverse face of the semiconductor substrate.

10. The electronic device cleaning method of claim 8, wherein the step (e) includes a step (f) of supplying oxygen gas to an area around the semiconductor substrate.

11. The electronic device cleaning method of claim 10, wherein the oxygen gas is supplied to the reverse face of the semiconductor substrate.

12. The electronic device cleaning method of claim 7, wherein an insulating film is formed on a face of the semiconductor substrate.

* * * * *